(12) United States Patent
Cai et al.

(10) Patent No.: US 10,830,731 B1
(45) Date of Patent: Nov. 10, 2020

(54) SENSOR DEVICES AND METHODS OF FORMING THE SAME

(71) Applicant: GLOBALFOUNDRIES Singapore Pte. Ltd., Singapore (SG)

(72) Inventors: Xinshu Cai, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/572,904

(22) Filed: Sep. 17, 2019

(51) Int. Cl.
*G01N 27/403* (2006.01)
*G01N 27/414* (2006.01)
*H01L 29/423* (2006.01)

(52) U.S. Cl.
CPC ..... *G01N 27/4148* (2013.01); *G01N 27/4145* (2013.01); *H01L 29/42324* (2013.01)

(58) Field of Classification Search
CPC ............ G01N 27/4148; G01N 27/4145; H01L 29/42324
USPC .......................................................... 257/243
See application file for complete search history.

(56) References Cited

U.S. PATENT DOCUMENTS

| 9,140,663 | B2 | 9/2015 | Toumazou et al. | |
| 9,541,521 | B1* | 1/2017 | Hoque | G01N 27/4148 |
| 9,599,587 | B2 | 3/2017 | Parris et al. | |
| 2011/0299337 | A1* | 12/2011 | Parris | H01L 27/11558 365/185.18 |
| 2015/0171018 | A1* | 6/2015 | Hoque | H01L 29/66825 257/253 |

FOREIGN PATENT DOCUMENTS

WO 2013/186537 A1 12/2013

OTHER PUBLICATIONS

Georgiou et al., "CMOS-based programmable gate ISFET", Electronics Letters, Oct. 23, 2008, 2 pages, vol. 44, No. 22.

* cited by examiner

*Primary Examiner* — Long K Tran
(74) *Attorney, Agent, or Firm* — Viering Jentschura & Partner MBB

(57) ABSTRACT

A sensor device may include a substrate, and first and second semiconductor structures arranged over the substrate. The first semiconductor structure may be an ion-sensitive field effect transistor and may include a floating gate, and a sensing element electrically coupled to the floating gate. The second semiconductor structure may be capacitively coupled to the first semiconductor structure, and may include a first diffusion region and a second diffusion region having opposite polarity type dopants, and a channel region arranged therebetween. The second semiconductor structure may be configured to receive a bias voltage to tune an electrical characteristic of the first semiconductor structure through the first diffusion region and the second diffusion region and the channel region. In some embodiments, the substrate may be a crystalline-on-insulator substrate which may be coupled to a back gate bias to reduce an effective total capacitance of the ISFET and further improve the coupling ratio.

19 Claims, 6 Drawing Sheets

US 10,830,731 B1

SENSOR DEVICES AND METHODS OF FORMING THE SAME

TECHNICAL FIELD

The present disclosure relates generally to semiconductor devices, and more particularly, to sensor devices and methods of forming the same.

BACKGROUND

Sensor devices such as ion-sensitive field effect transistors (ISFETs) may be used to sense ion concentrations in a solution such as in biomedical processes among various applications. The ISFETs may be fabricated by complementary metal-oxide-semiconductor (CMOS) processes. However, existing ISFETs fabricated using CMOS process suffer from initial threshold voltage (Vt) variations due to the presence of trapped charge in the floating gate of the ISFETs. Furthermore, the initial device state of an ISFET varies with process, such as due to the trapped charge, film thickness, and device size, which impacts the sensing accuracy of an ISFET. Accordingly, the electrical behavior of the ISFET may be difficult to determine. In addition, existing ISFETs are susceptible to large Vt due to the trapped charge, which prevents the sensor device from operating with lower voltages. In some cases, the Vt of the ISFETs vary widely, which causes mismatch amongst the ISFETs in a chip.

From the foregoing discussion, it is desirable to provide improved sensor devices that exhibit improved and controllable/tunable electrical characteristics while having high sensitivity.

SUMMARY

Embodiments generally relate to sensor devices and methods for forming sensor devices. According to various non-limiting embodiments, a sensor device may include a substrate, and a first semiconductor structure and a second semiconductor structure arranged over the substrate. According to various non-limiting embodiments, the first semiconductor structure may be an ion-sensitive field effect transistor (ISFET). The first semiconductor structure may include a source region and a drain region, and a floating gate arranged over the substrate and between the source region and the drain region. The first semiconductor structure may further include a sensing element electrically coupled to the floating gate for sensing an ion concentration of a solution. The second semiconductor structure may be capacitively coupled to the first semiconductor structure. The second semiconductor structure may include a first diffusion region having first polarity type dopants, and a second diffusion region having second polarity type dopants, and a channel region arranged therebetween. The first polarity type dopants and the second polarity type dopants may be opposite polarity type dopants. A second gate dielectric may be arranged at least over the channel region, and a second gate electrode may be arranged over the second gate dielectric. The second gate electrode may be connected to the floating gate. The substrate, the second gate electrode, and the second gate dielectric form a capacitor of the second semiconductor structure. The second semiconductor structure may be configured to receive a bias voltage to tune an electrical characteristic of the first semiconductor structure through the first diffusion region and the second diffusion region and the channel region. According to various non-limiting embodiments, the substrate may be a crystalline-on-insulator substrate which may be coupled to a back gate bias to reduce an effective total capacitance of the ISFET and further improve the coupling ratio. The reduced total capacitance may further improve the sensitivity of the ISFET.

According to various non-limiting embodiments, a method of forming the sensor device is provided. The method may include providing a substrate, forming a first semiconductor structure over the substrate, and further forming a second semiconductor structure over the substrate and capacitively coupled to the first semiconductor structure. The first semiconductor structure may include a source region and a drain region, and a floating gate over the substrate and between the source region and the drain region. The first semiconductor structure may further include a sensing element electrically coupled to the floating gate for sensing an ion concentration of a solution. The second semiconductor structure may include a first diffusion region having first polarity type dopants, and a second diffusion region having second polarity type dopants, and a channel region therebetween. The first polarity type dopants and the second polarity type dopants may be opposite polarity type dopants. The second semiconductor structure may further include a second gate dielectric at least over the channel region, and a second gate electrode over the second gate dielectric. The second gate electrode may be connected to the floating gate. The substrate, the second gate electrode, and the second gate dielectric form a capacitor of the second semiconductor structure. The second semiconductor structure may be configured to receive a bias voltage to tune an electrical characteristic of the first semiconductor structure through the first diffusion region and the second diffusion region and the channel region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1A:
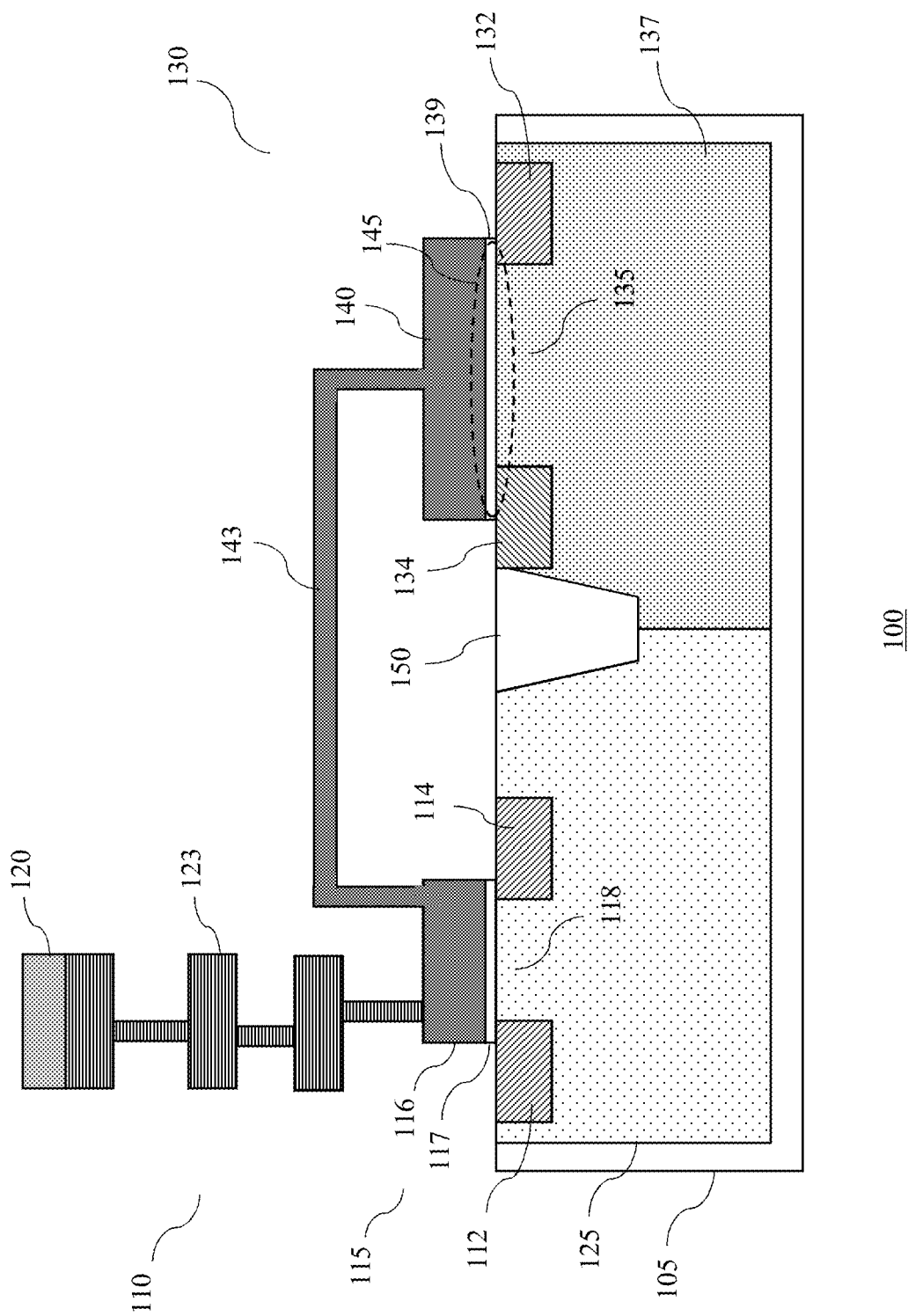
FIGS. 1A-1C show simplified cross-sectional views of embodiments of a sensor device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to semiconductor devices. More particularly, embodiments relate to sensor devices, such as ion-sensitive field effect transistor (ISFET) devices which may be used to sense an ion concentration of a solution (e.g., to detect ion concentration or a change in ion concentration). The sensor devices may convert the sensed ion concentration, for example, of a biochemical reaction, into electrical signals. According to various non-limiting embodiments, an ISFET device may include a capacitively coupled floating gate which may be programmable to tune or control electrical parameters or characteristics such as threshold voltage (Vt) of the floating gate (or the ISFET device), as well as reduce variations in Vt of the floating gate (or the ISFET device). According to various non-limiting embodiments, the floating gate of the ISFET device may be tunable to achieve a targeted or desired Vt through charge tunneling by applying a bias voltage through a control gate structure.

Figure 1B:
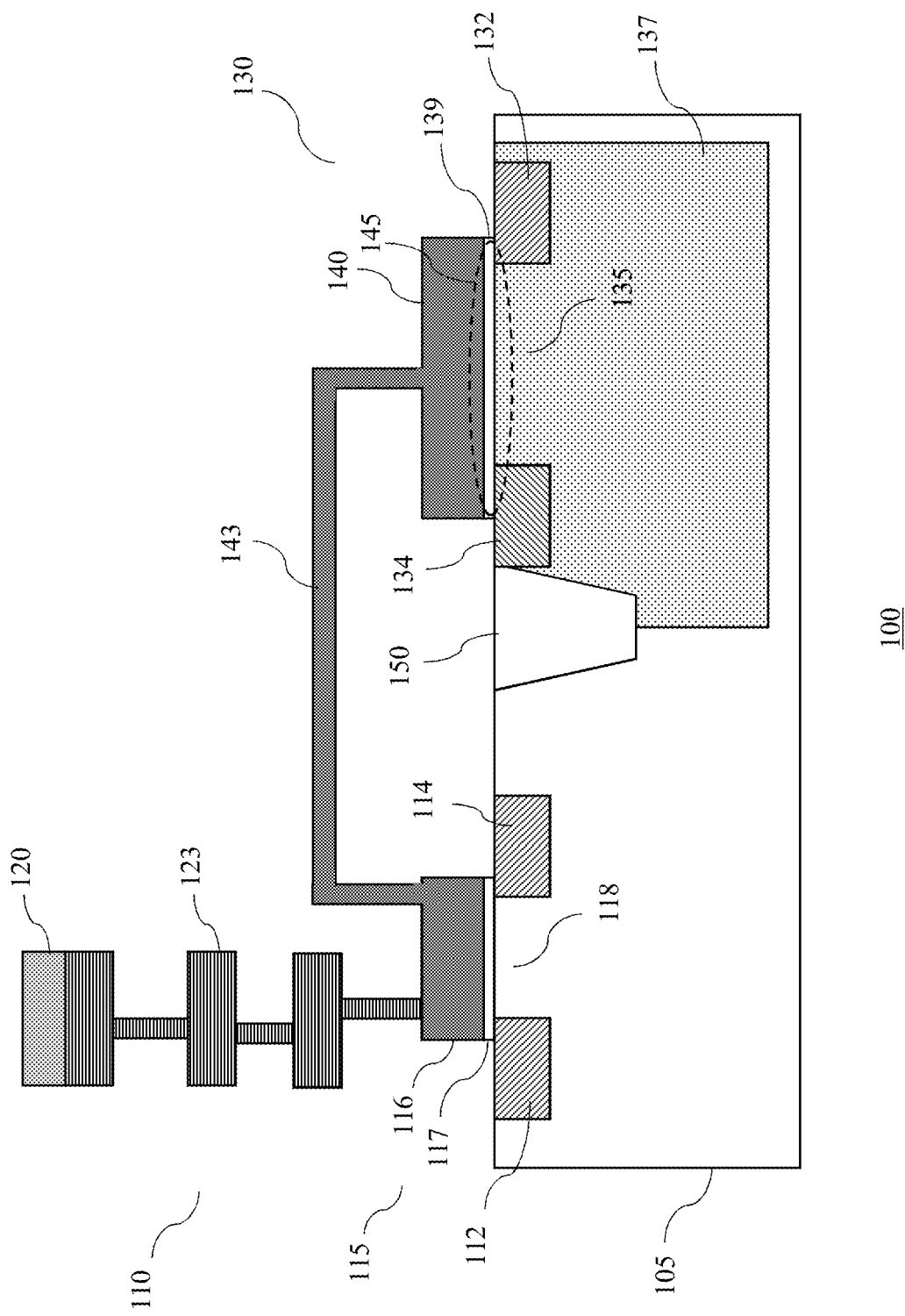
Figure 1C:
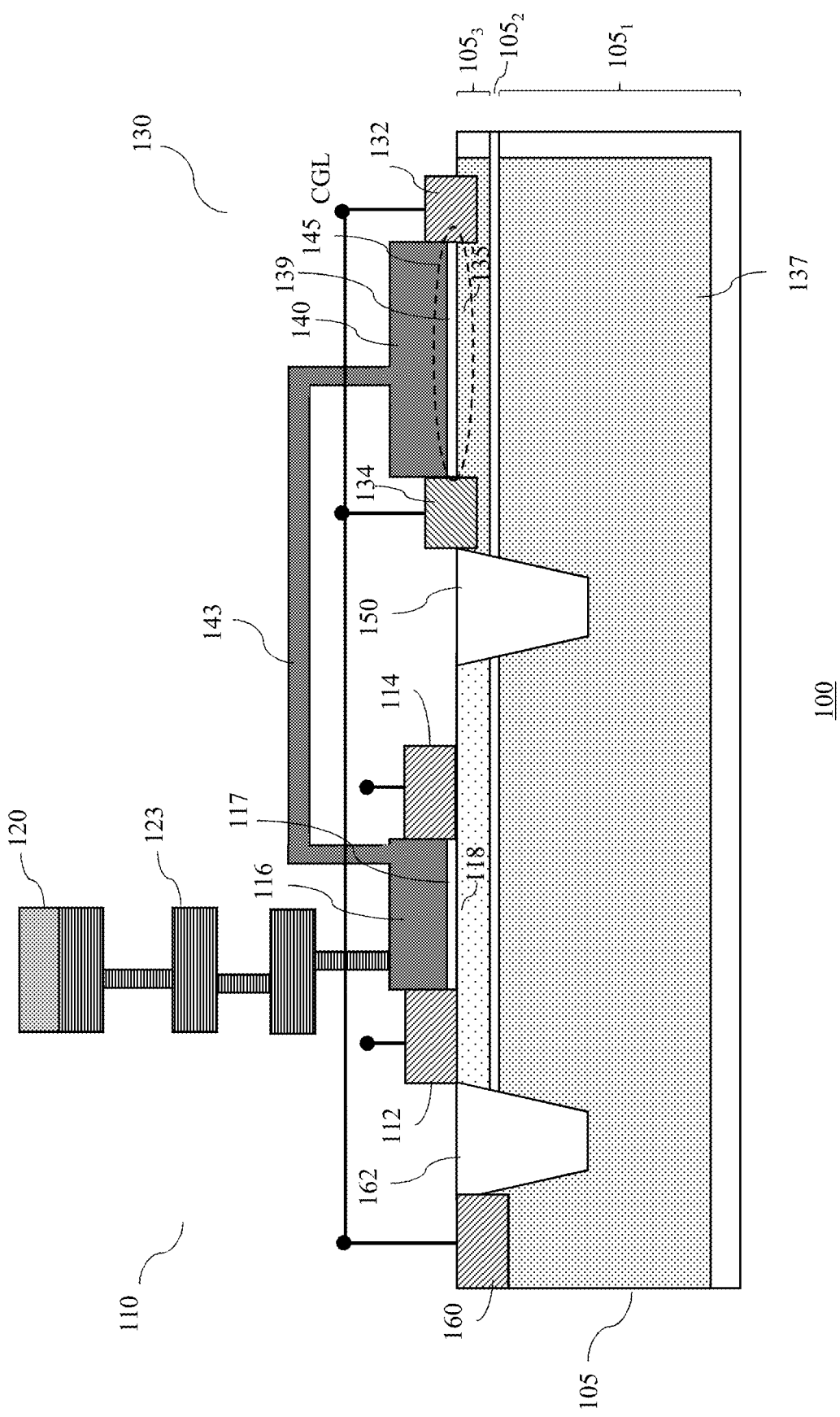

FIGS. 1A-1C show simplified cross-sectional views of embodiments of a sensor device 100. The sensor device 100 may include a substrate 105. The substrate 105 may be a semiconductor substrate, such as a silicon substrate in a non-limiting embodiment. Other types of semiconductor substrates may also be used. For example, the substrate may be silicon germanium, or crystalline-on-insulator (COI) substrate having an insulator layer formed of a dielectric insulating material (e.g., silicon-on-insulator (SOI) substrate), as well as intrinsic or doped with dopants.

According to various non-limiting embodiments, the sensor device 100 may include a first semiconductor structure 110 and a second semiconductor structure 130 arranged over the substrate 105. According to various non-limiting embodiments, the first semiconductor structure 110 may be an ISFET. According to various non-limiting embodiments, the second semiconductor structure 130 may be capacitively coupled to the first semiconductor structure 110. The second semiconductor structure 130 may include a capacitor 145 and may serve as a control gate structure or programming gate to which a bias voltage $V_{CG}$ may be applied for tuning or adjusting the electrical characteristics of the first semiconductor structure 110 (or a floating gate 115 of the ISFET device) by charge tunneling. The first semiconductor structure 110 and the second semiconductor structure 130 may be referred to as an ISFET device or a programmable gate ISFET device.

The first semiconductor structure 110 may include a source region and a drain region 112 and 114, and a channel region 118 (first channel region) therebetween. The first semiconductor structure 110 may further include a floating gate 115 arranged over the substrate and between the source region 112 and the drain region 114. The floating gate 115 may include a first floating gate electrode 116 and a first gate dielectric 117. The first semiconductor structure 110 may further include a sensing element 120 electrically coupled to the floating gate 115 for sensing an ion concentration of a solution. For example, the sensing element 120 may be, or include, one or more passivation layers and one or more conductive elements coupled to the first floating gate electrode 116 of the ISFET device. In a non-limiting example, the one or more passivation layers may be, or include silicon oxide, silicon nitride, aluminium oxide, or combinations thereof, while the conductive elements may be an uppermost metal of a CMOS process. The sensing element 120 may be configured to receive a solution-under-test and may be sensitive to ions (e.g., hydrogen ions). The sensing elements 120 may be coupled to the first floating gate electrode 116 by interconnects 123 (e.g., metal lines and via contacts). The metal lines and via contacts may be formed of a conductive material, such as copper, aluminum, tungsten, alloys thereof, or a combination thereof. Other suitable types of metals, alloys, or conductive materials may also be useful. The interconnects, for example, may be formed in a back-end-of-line (BEOL) process.

When in use, an ion concentration of the solution-under-test may change (e.g., due to a biochemical reaction occurring in the solution-under-test), and accordingly change the potential of the floating gate 115.

In various non-limiting embodiments, the source region 112 and the drain region 114 of the first semiconductor structure may be arranged in the substrate 105 and are at least partially arranged under the floating gate 115 (or first floating gate electrode 116), as illustrated in FIGS. 1A and 1B. The channel region 118 may be arranged between the source region 112 and the drain region 114 and beneath the floating gate 115. The source region 112 and the drain region 114 may be doped with dopants of a first polarity type for a first polarity type device (first polarity type ISFET device). For example, the first polarity type may be n-type dopants. Alternatively, the first polarity type may be p-type dopants. The source region 112 and the drain region 114 may be heavily doped regions, in a non-limiting embodiment. The dopant concentration of the source region 112 and the drain region 114, for example, may range from about 1E19 $cm^{-3}$ independently to about 1E20 $cm^{-3}$. Other dopant concentrations may also be useful. The source region 112 and the drain region 114 may have the same or different dopant concentrations.

In various non-limiting embodiments, the first semiconductor structure 110 may further include a first doped well 125, as illustrated in FIG. 1A. The first doped well 125 may be disposed in the substrate 105 and arranged to surround the source region 112 and the drain region 114. The first doped well 125 may be doped with dopants of a second polarity type (second polarity type doped well). In a non-limiting example, the first doped well 125 may be lightly or intermediately doped with dopants and have a dopant concentration ranging from about 1E15 $cm^{-3}$ independently to about 1E18 $cm^{-3}$. Other dopant concentrations may also be useful. The channel region 118 beneath the floating gate 115 may be formed by material or the dopant of the first doped well 125 in the substrate 105.

In various non-limiting embodiments, a second doped well 137 may be disposed in the substrate 105. The second doped well 137 may be doped with dopants of a first polarity type (i.e., first polarity type doped well). For example, the second doped well 137 may be intermediately doped. In a non-limiting example, the second doped well 137 may have a dopant concentration ranging from about 1E17 $cm^{-3}$ to about 1E18 $cm^{-3}$. Providing a second doped well having other dopant concentrations in the substrate may also be useful. In a non-limiting example, the first doped well 125 may include p-type dopants while the second doped well 137 may include n-type dopants for an n-type ISFET device. For example, the second doped well 137 may be an N-well. Alternatively, the first doped well 125 may include n-type dopants while the second doped well 137 may include p-type dopants for a p-type ISFET device.

According to various non-limiting embodiments, the second semiconductor structure 130 may include a first diffusion region 132 and a second diffusion region 134, and a channel region 135 (second channel region) arranged therebetween. The second doped well 137 may be arranged to surround the first diffusion region 132 and the second diffusion region 134, as illustrated in FIGS. 1A and 1B. In various non-limiting embodiments, the first diffusion region 132 and the second diffusion region 134 may be heavily doped regions. The first diffusion region 132 and the second diffusion region 134 may be coupled to a control gate line (CGL) (not illustrated) and configured to receive a bias voltage $V_{CG}$.

A second gate dielectric 139 may be arranged at least over the channel region 135. In various non-limiting embodiments, the second gate dielectric 139 may be, or include, an oxide layer, such as a silicon oxide layer. The second gate dielectric 139 may be formed by chemical vapor deposition (CVD), and/or thermal oxidation, in a non-limiting example. Other types of gate dielectric may also be useful. The second semiconductor structure 130 may include a second gate electrode 140 arranged over the second gate dielectric 139. The second gate electrode 140 may be connected to the first floating gate electrode 116. In various non-limiting embodiments, the first floating gate electrode 116 and the second gate electrode 140 may be interconnected polysilicon gates. The polysilicon gates may be doped in a non-limiting example. Other types of gates and material, such as metal, for the first floating gate electrode 116 and the second gate electrode 140 may also be useful. Further, the gate electrodes may be formed of the same or different material. According to various non-limiting embodiments, the first floating gate electrode 116 and the second gate electrode 140 may be electrically coupled by a conductive element 143. The conductive element 143 may be formed of the same material as the first floating gate electrode 116 and/or the second gate electrode 140, in a non-limiting example. For example, the conductive element 143 may be formed of polysilicon. Providing the conductive element 143 formed of metal may also be useful. The first floating gate electrode 116, the second gate electrode 140, and the conductive element 143 may be formed in the same or different process step. For example, the first floating gate electrode 116, the second gate electrode 140, and the conductive element 143 may be formed in the same polysilicon deposition, lithography and reactive-ion etching (ME) process, in a non-limiting example.

According to various non-limiting embodiments, the second gate dielectric 139 extends at least between the second gate electrode 140 and the substrate 105.

The substrate 105, the second gate electrode 140, and the second gate dielectric 139 may form a capacitor 145 in part of the substrate 105. More particularly, the capacitor 145 of the second semiconductor structure may be formed between the second doped well 137 and the second gate electrode 140. For example, in the case the second gate electrode 140 is formed of polysilicon, the capacitor 145 may be a poly-to-well capacitor. The second semiconductor structure 130 may be configured to receive the bias voltage $V_{CG}$ (e.g., via a CGL) applied to the first diffusion region 132 and second diffusion region 134 and effect movement of charge selectively between the floating gate 115 and the capacitor 145 in response to the bias voltage $V_{CG}$. The floating gate 115 (or the first semiconductor structure) of the ISFET device may be accessed by the second semiconductor structure 130, which allows to modulate the trapped charge by a tuning or biasing voltage $V_{CG}$. For example, the bias voltage $V_{CG}$ may be applied to the second semiconductor structure 130 to remove trapped charge from the floating gate 115 of the first semiconductor structure 110 through the capacitor 145. Further, programming operations of the floating gate 115 (or the first semiconductor structure 110) may be performed to tune the ISFET device to the desired Vt by applying a bias voltage $V_{CG}$ to the first diffusion region 132 and the second diffusion region 134 of the second semiconductor structure 130, effecting charge tunneling between the channel region 118 of the substrate and the floating gate 115. The bias voltage $V_{CG}$ may be coupled from the second semiconductor structure 130 to the floating gate 115 through the channel region 135, the first diffusion region 132 and second diffusion region 134 to the first floating gate electrode 116 and the second gate electrode 140. Providing the first diffusion region 132 and the second diffusion region 134 in the second doped well 137 with opposite polarity type dopants further improves the coupling ratio of the bias voltage $V_{CG}$ to the ISFET device (or the first semiconductor structure).

According to various non-limiting embodiments, the first diffusion region 132 may be doped with dopants of the first polarity type, while the second diffusion region 134 may be doped with dopants of the second polarity type. The first polarity type dopants and the second polarity type dopants are opposite polarity type dopants. Said differently, the first diffusion region 132 and the second diffusion region 134 are doped with opposite polarity type dopants. For example, in the case the first diffusion region 132 is doped with n-type dopants, the second diffusion region 134 may be doped with p-type dopants. Alternatively, in the case the first diffusion region 132 is doped with p-type dopants, the second diffusion region 134 may be doped with n-type dopants. In various non-limiting embodiments, the first diffusion region 132 and the second diffusion region 134 may be coupled to a common CGL. The control gate structure (i.e., second semiconductor structure 130) of the ISFET device having the capacitor 145 and the opposite polarity types first diffusion region 132 and second diffusion region 134 advantageously increases and improves a coupling ratio of the CGL (biasing voltage $V_{CG}$) of the ISFET device.

According to various non-limiting embodiments, the second semiconductor structure 130 may be used to program the first semiconductor structure 110 to a desired Vt by electron tunneling (e.g., Fowler-Nordheim (FN) tunneling). For example, bias voltages $V_{CG}$ (e.g., high biasing voltage) applied to the first diffusion region 132 and the second diffusion region 134 triggers electron tunneling from the channel region 118 through the first gate dielectric 117 to the first floating gate electrode 116 (i.e., electron tunneling from the substrate to the floating gate 115) during programming operations.

In various non-limiting embodiments, the first diffusion region 132 and the second diffusion region 134 of the second semiconductor structure may be arranged in the substrate 105 and are at least partially arranged under the second gate electrode 140, as illustrated in FIGS. 1A and 1B.

In various non-limiting embodiments, the substrate 105 may include one or more isolation regions. An isolation region 150 may be arranged adjacent to the second diffusion region 134 of the second semiconductor structure 130. The isolation regions, for example, may be shallow trench isolation (STI) regions in a non-limiting example. Other types of isolation regions may also be useful. For example, isolation regions may be used to isolate the second semiconductor structure 130 from the first semiconductor structure 110 in the substrate 105. Other configurations of isolation regions may also be useful.

In other embodiments, the ISFET device (or sensor device) may be fabricated or formed from a native device. As illustrated in FIG. 1B, the ISFET device may be fabricated without a doped well in the substrate 105 beneath the floating gate 115 as described with respect to FIG. 1A (e.g., first doped well). In other words, the first semiconductor structure 110 is an ISFET formed from a native device, where the channel region 118 beneath the floating gate 115 is formed of an intrinsic semiconductor material of the substrate 105. In the case the ISFET device (or sensor device) is a native device, the substrate 105 may be lightly doped with second polarity type dopants, without doping or may have intrinsic or pure doping. In the case the substrate contains lightly doped second polarity type dopants, the dopant concentration of the substrate may range from about $1E13\ cm^{-3}$ to about $1E16\ cm^{-3}$. Providing the sensor device as a native device enables a higher margin or flexibility to tune the device by programming operations to the desired target Vt depending on application (i.e., so as to enable a larger or wider tuning range of the ISFET device in the case a doped well is not formed in the substrate beneath the floating gate 115). Further, providing the sensor device as a native device advantageously enables multiple Vt option (or more range of Vt) within the same chip.

Referring to FIG. 1C, the substrate 105 may be a COI substrate having a bulk substrate $105_1$, a buried insulator layer (e.g., buried oxide (BOX) layer) $105_2$ over the bulk substrate, and a surface crystalline layer $105_3$ over the buried oxide layer. For example, an insulator layer of the COI substrate may be formed from silicon oxide, which provides the BOX layer. Examples of the COI substrate may include, but are not limited to, a silicon-on-insulator (SOI) substrate, a germanium-on-insulator (GeOI) substrate, a SiGe-on-insulator (SiGe-OI) substrate, or combinations thereof.

As illustrated, the first semiconductor structure 110 may be arranged over the surface crystalline layer $105_3$ of the substrate. In the case of a COI substrate, the source region 112 and the drain region 114 of the first semiconductor structure 110 may be raised and arranged on the crystalline layer $105_3$. The source region 112 and drain region 114 may be arranged adjacent to the sidewalls of the first floating gate electrode 116 and the first gate dielectric 117. The channel region 118 between the source region 112 and drain region 114 may be disposed beneath the first floating gate electrode 116 and in the crystalline layer $105_3$. For example, the channel region 118 beneath the first floating gate electrode 116 may be formed of intrinsic semiconductor material in the surface crystalline layer $105_3$ or dopants of a second polarity type doped well formed in the surface crystalline layer $105_3$.

In the case a COI substrate is used, the second doped well 137 may be disposed in the bulk substrate $105_1$ and a portion of the surface crystalline layer $105_3$ beneath the second gate electrode 140. According to various non-limiting embodiments, the first diffusion region 132 and the second diffusion region 134 may be at least partially arranged in the second doped well 137, as illustrated in FIG. 1C. The channel region 135 may be formed between the first diffusion region 132 and the second diffusion region 134 in a portion of the surface crystalline layer $105_3$ of the substrate beneath the second gate electrode 140.

The isolation region 150 may be arranged adjacent to the second diffusion region 134 of the second semiconductor structure 130. In various non-limiting embodiments, a third diffusion region 160 may be further arranged in the second doped well 137. The first diffusion region 132, second diffusion region 134 and third diffusion region 160 may be coupled to a common CGL in a non-limiting embodiment. A second isolation region 162 may be arranged between the source region 112 and the third diffusion region 160.

In various non-limiting embodiments, the second doped well 137 in the COI substrate may serve as a back gate and may be coupled to a back gate bias to increase the coupling ratio of the second semiconductor structure (or control gate structure/programming gate) to the first semiconductor structure (or floating gate 115). By using the COI substrate and biasing the back gate in the COI substrate, a total capacitance $C_{total}$ of the ISFET device in the substrate 105 may be reduced, which improves sensitivity of the ISFET device. Advantageously, a read sensitivity of the sensor device may be improved.

For example, a coupling ratio of the control gate structure, $CR_{CGL}$ may be obtained as follows:

$$CR_{CGL} = \frac{C_{TOX1}}{C_{TOX1} + C_{TOX2} \parallel C_{BOX}} \qquad \text{Equation 1}$$

where $C_{TOX2}$ may denote capacitance due to the floating gate 115 of the ISFET device, $C_{BOX}$ may denote capacitance due to the buried oxide layer in the substrate, and $C_{TOX1}$ may denote capacitance due to the capacitor 145.

As the capacitance due to the buried oxide layer $105_2$, $C_{BOX}$ may be configured such that it is a lot smaller relative to the capacitance due to the floating gate 115, $C_{TOX2}$ (i.e., $C_{TOX2} \gg C_{BOX}$), the total capacitance $C_{total}$ of the ISFET device in the substrate 105 may be effectively $C_{total} = C_{TOX1} C_{TOX2} \parallel C_{BOX} = C_{TOX1} + C_{BOX}$. In other words, about 50% decrease in the total capacitance of the ISFET device in the substrate may be achieved in the case a COI substrate and back gate is employed. Due to the reduced total capacitance $C_{total}$ of the ISFET device in the substrate 105, the coupling ratio of the control gate structure, $CR_{CGL}$ may be increased as follows:

$$CR_{CGL} \sim \frac{C_{TOX1}}{C_{TOX1} + C_{BOX}} \qquad \text{Equation 2}$$

According to various non-limiting embodiments, a coupling ratio $CR_{CGL}$ of more than about 0.9 may be achieved by employing the COI substrate and back gate.

Figure 2:
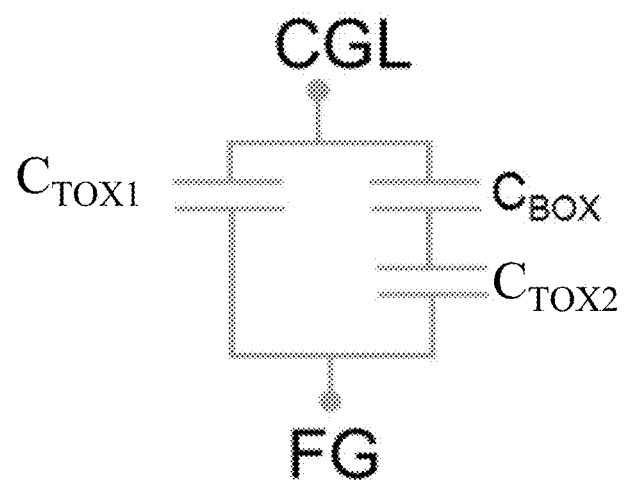
FIG. 2 illustrates an exemplary schematic of the capacitance of an ISFET device in a substrate of the sensor device.

FIG. 2 illustrates an exemplary schematic of the capacitance of the ISFET device in the substrate. Based on $$\Delta V_T = \frac{\Delta Qsensing}{C_{Total}},$$

with a decrease in the total capacitance $C_{total}$ of the ISFET device in the substrate 105 while having the same sensing charge, the device Vt will have a bigger change/response due to ion concentration sensed by the sensing element, and accordingly a larger sensed current from the channel region 118, therefore providing the ISFET device with higher sensitivity.

In various non-limiting examples, the p-type dopants may be, or include, boron (B), aluminum (Al), indium (In), or a combination thereof, while n-type dopants may be, or include, phosphorus (P), arsenic (As), antimony (Sb), or a combination thereof. The dopants may be formed by ion implantation using implant masks, in a non-limiting example. For example, the first diffusion region may be formed using a first implant mask for the first diffusion region, while the second diffusion region may be formed using a second implant mask for the second diffusion region.

In various non-limiting embodiments, the ISFET devices may be integrated into CMOS processes.

In various non-limiting embodiments, the sensor device may be, or include, an array of ISFET devices on a substrate or chip. In various non-limiting embodiments, the sensor device may include a plurality of first semiconductor structures and second semiconductor structures over the substrate or chip. Each first semiconductor structure may be coupled to each second semiconductor structure over the substrate. The sensor device may include an array of ISFET devices, such that each second semiconductor structure is capacitively coupled to a first semiconductor structure to program the Vt of a respective ISFET device.

Figure 3:
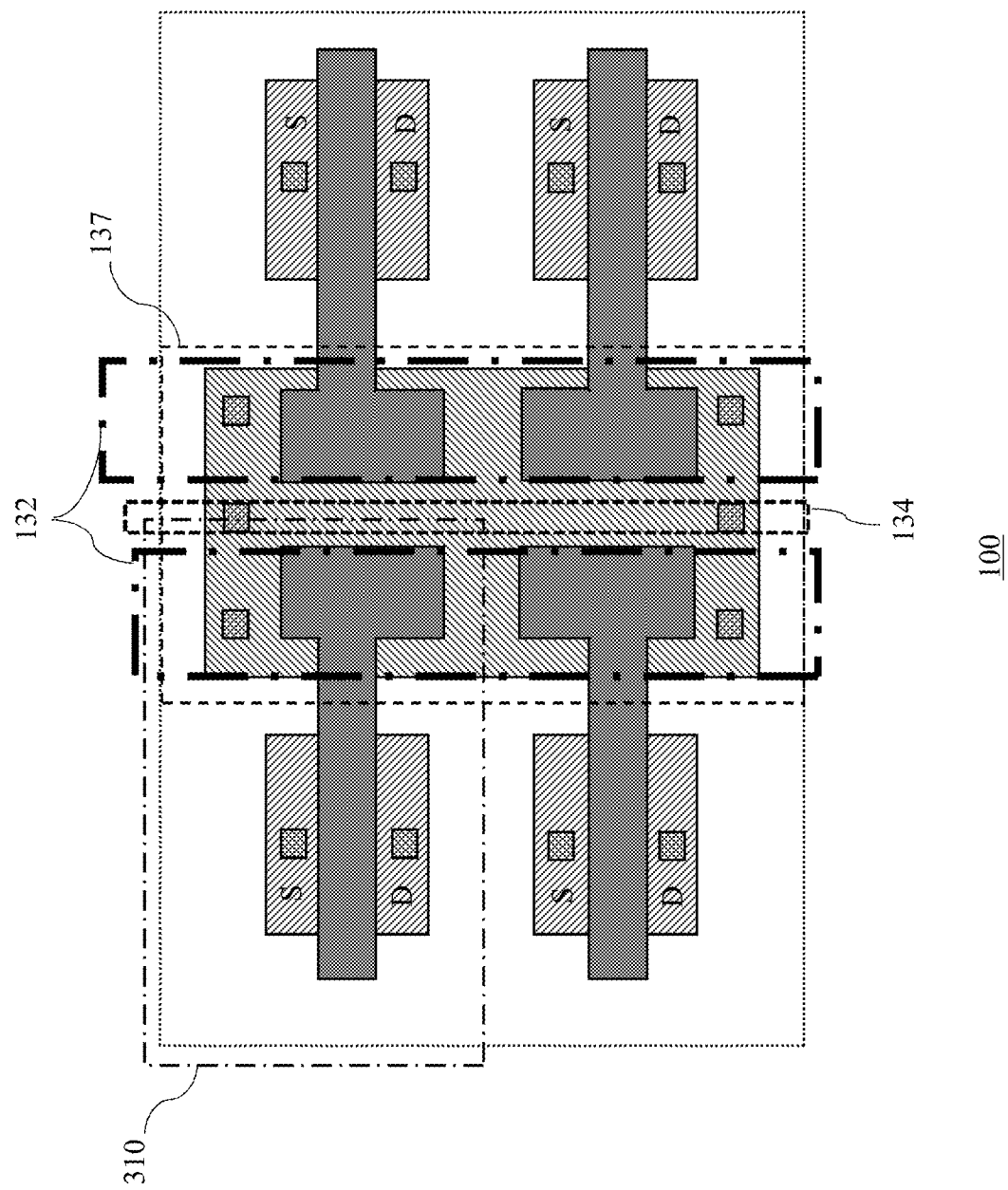
FIG. 3 shows a simplified top view of an embodiment of the sensor device.

FIG. 3 shows a simplified top view of an embodiment of the sensor device 100. Referring to FIG. 3, the sensor device 100 may include an array of the ISFET devices 310. Illustratively, the top view shows a portion of the array of the ISFET devices. In various non-limiting embodiments, the ISFET devices may share a common second doped well 137 for forming the capacitor of the second semiconductor structures. Said differently, a common second doped well 137 may be shared by different cells of the sensor device (e.g., adjacent cells of the sensor device). Additionally, a common first diffusion region 132 may be shared by different ISFET devices. Similarly, a common second diffusion region 134 may be shared by different ISFET devices. Accordingly, a smaller and more compact cell size may utilized for the sensor device. Contacts may be disposed over the diffusion regions and coupled to a CGL.

In various example embodiments, the following biasing voltage may be applied to selected and unselected ISFET devices of the array.

| | Select | Un-select |
|---|---|---|
| Source and drain regions | 0 | $V_{inhibit}$ |
| First and second diffusion regions in coupling well (second doped well) | High Voltage | 0 |

Figure 4:
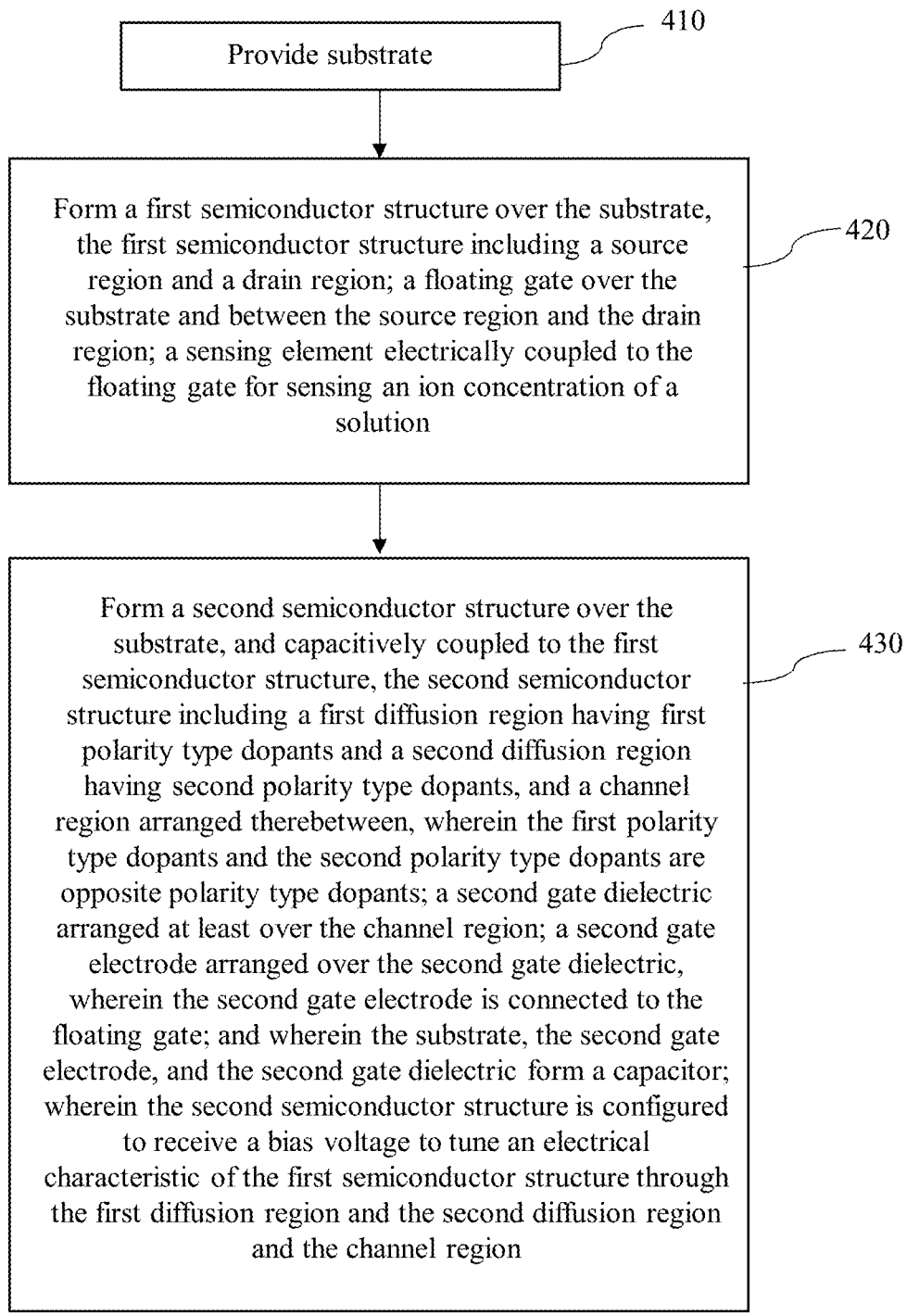
FIG. 4 shows a block diagram of an exemplary process for forming a sensor device.

FIG. 4 shows a block diagram of an exemplary process 400 for forming a sensor device. The device, for example, is similar to that described in FIGS. 1A-1C and FIG. 3. Common elements may not be described or described in detail. At 410, a substrate as described above may be provided.

At 420, a first semiconductor structure may be formed over the substrate. Forming the first semiconductor structure may include forming a source region and a drain region. A floating gate may be formed over the substrate and between the source region and the drain region. Forming the floating gate may include forming a first floating gate electrode and a first gate dielectric over the substrate and between the source region and the drain region. A sensing element may be formed over the substrate. The sensing element may be electrically coupled to the floating gate for sensing an ion concentration of a solution.

At 430, a second semiconductor structure may be formed over the substrate. The second semiconductor structure may be capacitively coupled to the first semiconductor structure. Forming the second semiconductor structure may include forming a first diffusion region having first polarity type dopants and a second diffusion region having second polarity type dopants. The first polarity type dopants and the second polarity type may be opposite polarity type dopants.

The first diffusion region and the second diffusion region may be formed such that a channel region is formed therebetween. According to various non-limiting embodiments, a first polarity type doped well may be formed in the substrate. The first polarity type doped well may surround the first diffusion region and the second diffusion region. The channel region may be formed of material or dopants of the first polarity type doped well. A second gate dielectric may be formed at least over the channel region and between the first diffusion region and the second diffusion region. A second gate electrode may be formed over the second gate dielectric such that the second gate electrode is connected to the floating gate. The substrate, the second gate electrode, and the second gate dielectric may form a capacitor. The second semiconductor structure may be configured to receive a bias voltage via the first diffusion region and the second diffusion region and effect movement of charge selectively between the floating gate and the capacitor in response to the bias voltage.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A sensor device comprising:
   a substrate;
   a first semiconductor structure arranged over the substrate, the first semiconductor structure comprising:
      a source region and a drain region;
      a floating gate including a first gate dielectric and a first gate electrode over the substrate and between the source region and the drain region; and
      a sensing element (104) electrically coupled to the floating gate for sensing an ion concentration of a solution; and
   a second semiconductor structure arranged over the substrate and capacitively coupled to the first semiconductor structure, the second semiconductor structure comprising:
      a first diffusion region comprising first polarity type dopants, and a second diffusion region comprising second polarity type dopants, and a channel region arranged therebetween; wherein the first polarity type dopants and the second polarity type dopants are opposite polarity type dopants;
      a second gate dielectric arranged at least over the channel region;
      a second gate electrode arranged over the second gate dielectric; wherein the second gate electrode is connected to the floating gate; and
      wherein the substrate, the second gate electrode, and the second gate dielectric form a capacitor; wherein the second semiconductor structure is configured to receive a bias voltage to tune an electrical characteristic of the first semiconductor structure through the first diffusion region and the second diffusion region and the channel region.

2. The sensor device of claim 1, wherein:
   the source region and the drain region of the first semiconductor structure are arranged in the substrate and are at least partially arranged under the floating gate, and
   the first diffusion region and the second diffusion region of the second semiconductor structure are arranged in the substrate and are at least partially arranged under the second gate electrode.

3. The sensor device of claim 1, further comprising a first polarity type doped well within the substrate; wherein the first polarity type doped well surrounds the first diffusion region and the second diffusion region, and wherein the capacitor is formed between the doped well and the second gate electrode.

4. The sensor device of claim 1, wherein the first diffusion region and the second diffusion region are coupled to a common control gate line (CGL).

5. The sensor device of claim 1, wherein the first semiconductor structure is an ISFET formed from a native device.

6. The sensor device of claim 1, wherein the substrate is a crystalline-on-insulator substrate having a bulk substrate, a buried oxide layer over the bulk substrate, and a surface crystalline layer over the buried oxide layer.

7. The sensor device of claim 6, further comprising a first polarity type doped well within the substrate; wherein the first polarity type doped well is coupled to a back gate bias.

8. The sensor device of claim 6, further comprising a first polarity type doped well within the substrate; wherein the first diffusion region and the second diffusion region of the second semiconductor structure are arranged at least partially in the first polarity type doped well.

9. The sensor device of claim 1, further comprising an array having a plurality of first semiconductor structures and second semiconductor structures; wherein each first semiconductor structure is coupled to each second semiconductor structure over the substrate; wherein the second semiconductor structures comprise a common first diffusion region and a common second diffusion region.

10. The sensor device of claim 1, wherein the floating gate comprises a first floating gate electrode, wherein the first floating gate electrode and the second gate electrode are interconnected polysilicon gates.

11. A method of forming a sensor device comprising:
   Providing a substrate;
   Forming a first semiconductor structure over the substrate, the first semiconductor structure comprising:
      a source region and a drain region;
      a floating gate including a first gate dielectric and a first gate electrode over the substrate and between the source region and the drain region; and
      a sensing element electrically coupled to the floating gate for sensing an ion concentration of a solution; and
   forming a second semiconductor structure arranged over the substrate and capacitively coupled to the first semiconductor structure, the second semiconductor structure comprising:
      a first diffusion region comprising first polarity type dopants, and a second diffusion region comprising second polarity type dopants, and a channel region arranged therebetween; wherein the first polarity type dopants and the second polarity type dopants are opposite polarity type dopants;
      a second gate dielectric arranged at least over the channel region;
      a second gate electrode arranged over the second gate dielectric; wherein the second gate electrode is connected to the floating gate; and
      wherein the substrate, the second gate electrode, and the second gate dielectric form a capacitor; wherein the second semiconductor structure is configured to receive a bias voltage to tune an electrical characteristic of the first semiconductor structure through the first diffusion region and the second diffusion region and the channel region.

12. The method of claim 11, wherein:
the source region and the drain region of the first semiconductor structure are arranged in the substrate and are at least partially arranged under the floating gate, and
the first diffusion region and the second diffusion region of the second semiconductor structure are arranged in the substrate and are at least partially arranged under the second gate electrode.

13. The method of claim 11, further comprising a first polarity type doped well within the substrate; wherein the first polarity type doped well surrounds the first diffusion region and the second diffusion region, and wherein the capacitor structure is formed between the doped well and the second gate electrode.

14. The method of claim 11, wherein the first semiconductor structure is an ISFET formed from a native device.

15. The method of claim 11, wherein the substrate is a crystalline-on-insulator substrate having a bulk substrate, a buried oxide layer over the bulk substrate, and a crystalline layer over the buried oxide layer.

16. The method of claim 15, further comprising a first polarity type doped well within the substrate; wherein the first polarity type doped well is coupled to a back gate bias.

17. The method of claim 15, further comprising a first polarity type doped well within the substrate; wherein the first diffusion region and the second diffusion region of the second semiconductor structure are arranged at least partially in the first polarity type doped well.

18. The method of claim 11, further comprising an array having a plurality of first semiconductor structures and second semiconductor structures; wherein each first semiconductor structure is coupled to each second semiconductor structure over the substrate, wherein the second semiconductor structures comprise a common first diffusion region and a common second diffusion region.

19. The method of claim 11, wherein the floating gate comprises a first floating gate electrode, wherein the first floating gate electrode and the second gate electrode are interconnected polysilicon gates.

* * * * *